(12) United States Patent
Jin

(10) Patent No.: US 9,780,080 B2
(45) Date of Patent: Oct. 3, 2017

(54) METHOD FOR MAKING AN OPTICAL PROXIMITY SENSOR BY ATTACHING AN OPTICAL ELEMENT TO A PACKAGE TOP PLATE AND FORMING A PACKAGE BODY TO DEFINE AN OPTICAL TRANSMIT CAVITY AND AN OPTICAL RECEIVE CAVITY

(71) Applicant: STMICROELECTRONICS PTE LTD, Singapore (SG)

(72) Inventor: Yonggang Jin, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 413 days.

(21) Appl. No.: 14/510,433

(22) Filed: Oct. 9, 2014

(65) Prior Publication Data

US 2016/0104698 A1 Apr. 14, 2016

(51) Int. Cl.
| | |
|---|---|
| *H01L 25/00* | (2006.01) |
| *H01L 25/16* | (2006.01) |
| *G06F 1/32* | (2006.01) |
| *H03K 17/94* | (2006.01) |
| *G06F 3/01* | (2006.01) |

(52) U.S. Cl.
CPC ............ *H01L 25/50* (2013.01); *G06F 1/3231* (2013.01); *H01L 25/165* (2013.01); *H01L 25/167* (2013.01); *H03K 17/941* (2013.01); *G06F 3/017* (2013.01); *H01L 2924/0002* (2013.01); *H03K 2217/94108* (2013.01); *H04M 2250/12* (2013.01)

(58) Field of Classification Search
CPC . H01L 25/167; H01L 31/0203; H01L 25/165; G02B 6/4246; G02B 6/43; G02B 6/4272; G02B 27/0006; G02B 19/0085; G02B 6/4201; G02B 6/4251
USPC .......................................... 250/221, 551, 239
See application file for complete search history.

(56) References Cited

U.S. PATENT DOCUMENTS

| | | | | |
|---|---|---|---|---|
| 5,391,891 | A * | 2/1995 | Wiegleb | B60S 1/0822 250/227.25 |
| 8,928,893 | B2 * | 1/2015 | Findlay | H03K 17/941 250/214 AL |
| 2010/0327164 | A1 | 12/2010 | Costello et al. | |
| 2011/0024627 | A1 | 2/2011 | Yao | |
| 2012/0025211 | A1 | 2/2012 | Yeh et al. | |
| 2012/0132793 | A1 | 5/2012 | Campbell et al. | |

(Continued)

FOREIGN PATENT DOCUMENTS

| | | |
|---|---|---|
| CN | 101936752 A | 1/2011 |
| CN | 103620779 A | 3/2014 |

(Continued)

*Primary Examiner* — Que T Le
(74) *Attorney, Agent, or Firm* — Slater Matsil, LLP

(57) ABSTRACT

A method for making an optical proximity sensor includes forming a package top plate having an optical transmit opening and an optical receive opening extending therethrough, attaching an optical transmit element to the package top plate adjacent the optical transmit opening, and attaching an optical receive element to the package top plate adjacent the optical receive opening. A package body is formed onto the package top plate to define an optical transmit cavity receiving the optical transmit element and an optical receive cavity receiving the optical receive element.

25 Claims, 5 Drawing Sheets

(56) References Cited

U.S. PATENT DOCUMENTS

| | | |
|---|---|---|
| 2012/0133956 A1 | 5/2012 | Findlay et al. |
| 2012/0223231 A1 | 9/2012 | Nijaguna |
| 2013/0019461 A1 | 1/2013 | Rudmann et al. |
| 2014/0061447 A1 | 3/2014 | Campbell et al. |
| 2014/0103199 A1 | 4/2014 | Loong et al. |
| 2014/0158889 A1 | 6/2014 | Ruh |
| 2014/0231633 A1 | 8/2014 | Parodi-Keravec et al. |
| 2016/0104698 A1 | 4/2016 | Jin |

FOREIGN PATENT DOCUMENTS

| | | |
|---|---|---|
| CN | 103727965 A | 4/2014 |
| CN | 103837174 A | 6/2014 |
| CN | 205091459 U | 3/2016 |
| TW | M399313 U | 3/2011 |

\* cited by examiner

METHOD FOR MAKING AN OPTICAL PROXIMITY SENSOR BY ATTACHING AN OPTICAL ELEMENT TO A PACKAGE TOP PLATE AND FORMING A PACKAGE BODY TO DEFINE AN OPTICAL TRANSMIT CAVITY AND AN OPTICAL RECEIVE CAVITY

FIELD OF THE INVENTION

The present invention relates to the field of electronic devices, and more particularly, to a method of making an optical proximity sensor.

BACKGROUND

Proximity sensors are designed to detect the presence of nearby objects without physical contact. Optical proximity sensors utilize light sensitive elements to detect objects.

An optical proximity sensor includes an optical transmitter and an optical receiver. Optical proximity sensing is based on emitting light from the optical transmitter, capturing light reflected back to the optical receiver by a nearby object, and processing the reflected light to determine the proximity of the object to the sensor.

Optical proximity sensors are used in many applications, including mobile communications devices. For example, an optical proximity sensor may be used to determine when a mobile phone is held close to a user's face so as to turn off the mobile phone's display to conserve power.

A typical optical proximity sensor includes an enclosure assembly that is attached to a connector plate assembly that includes the optical transmitter and the optical receiver. As illustrated in FIGS. 1 and 2, the enclosure assembly 10 includes a package housing 12 formed with an optical transmit cavity 14 that is to receive the optical transmit element, and an optical receive cavity 16 that is to receive the optical receive element.

The package housing 12 has an optical transmit opening 24 extending therethrough to the optical transmit cavity 14, and an optical receive opening 26 extending therethrough to the optical receive cavity 16. Positioned within the respective cavities 14, 16 is an optical transmit element 34 and an optical receive element 36. Glue 40 is deposited within the respective cavities 14, 16 to hold the optical transmit and receive elements 34, 36 in place. The optical transmit and receive elements 34, 36 protect the optical transmitter and receiver, as well as filter undesired light.

As dimensions of optical proximity sensors are reduced, it becomes more difficult to dispense glue on the package housing 10 within the optical transmit cavity 14 and the optical receive cavity 16. This slows down the throughput of making optical proximity sensors. This problem is further compounded with a corresponding reduction in thickness of the optical transmit and receive elements 34, 36. Consequently, there is a need to address these concerns as the dimensions of optical proximity sensors are reduced.

SUMMARY OF THE INVENTION

In view of the foregoing background, it is therefore an object of the present invention to provide a method for making an optical proximity sensor that simplifies attachment of optical transmit and receive elements within the sensor.

This and other objects, features, and advantages in accordance with the present invention are provided by a method for making an optical proximity sensor comprising forming a package top plate having an optical transmit opening and an optical receive opening extending therethrough, attaching an optical transmit element to the package top plate adjacent the optical transmit opening, and attaching an optical receive element to the package top plate adjacent the optical receive opening. The method may further comprise forming a package body onto the package top plate to define an optical transmit cavity receiving the optical transmit element and an optical receive cavity receiving the optical receive element.

The method may further comprising depositing glue on the package top plate adjacent the optical transmit opening and adjacent the optical receive opening before attaching the optical transmit and receive elements. By forming the package top plate separately from the package body, this advantageously provides plenty of room to dispense the glue.

Another advantage of separately forming the package top plate from the package body is that this may also allow for an increase in the throughput of making the optical proximity sensor since attachment of optical transmit and receive elements has been simplified.

The package body may comprise sidewalls around an outer perimeter of the package top plate, and a separation wall between the optical transmit cavity and the optical receive cavity. The package body may be formed so that there is a gap between the sidewalls and outer edges of the optical transmit and receive elements, and a gap between the separation wall and outer edges of the optical transmit and receive elements. In an alternate embodiment, the package body may be formed so that the sidewalls and the separation wall contact the outer edges of the optical transmit and receive elements.

The method may further comprise forming a connector plate assembly comprising an optical transmitter and an optical receiver. The connector plate assembly may be attached to the package body so that the optical transmitter is received by the optical transmit cavity and the optical receiver is received by the optical receive cavity.

The optical transmit element and the optical receive element may comprise glass, for example. A thickness of the optical transmit element and the optical receive element may be within a range of about 200-300 microns, for example.

The optical transmit element and the optical receive element may be rectangular shaped. Each side of the optical transmit element and the optical receive element may be within a range of about 0.5-1.00 millimeters, for example.

A diameter of the optical transmit opening and the optical receive opening may be within a range of about 0.3-0.5 millimeters, for example. The package top plate and the package body may be formed using thermoplastic molding material.

Another aspect is directed to an optical proximity sensor as described above where a joint line is formed at an interface between the package body and the package top plate.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
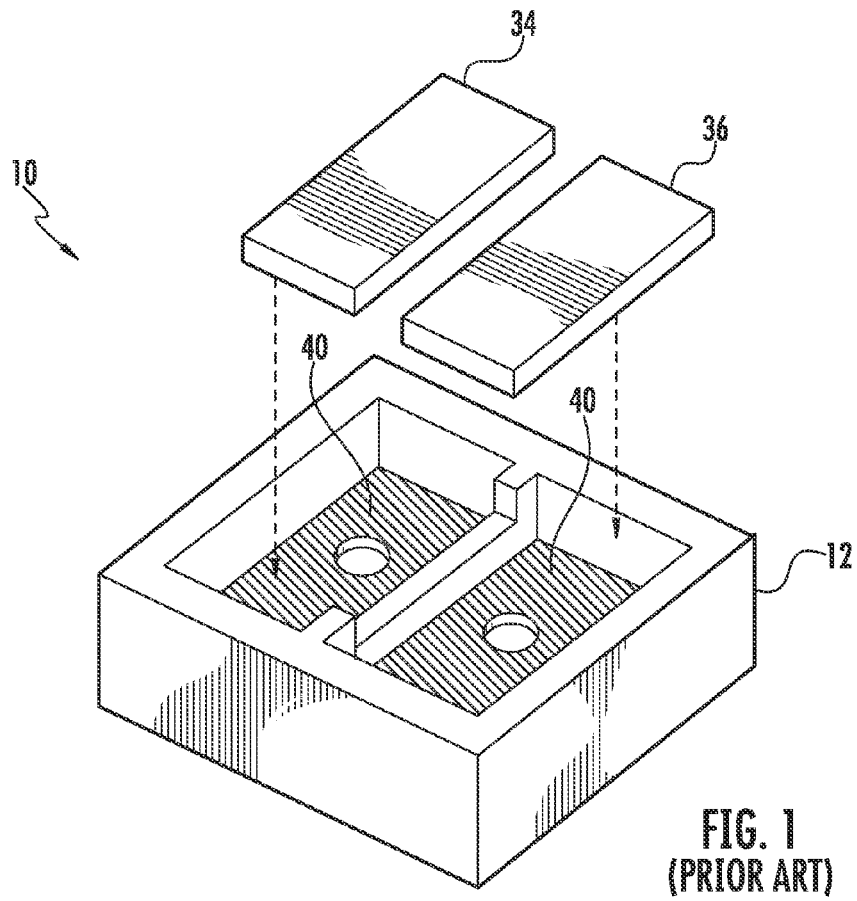
FIG. 1 is a perspective view of an enclosure assembly for an optical proximity sensor, with the optical transmit and receive elements separated therefrom, in accordance with the prior art.
Figure 2:
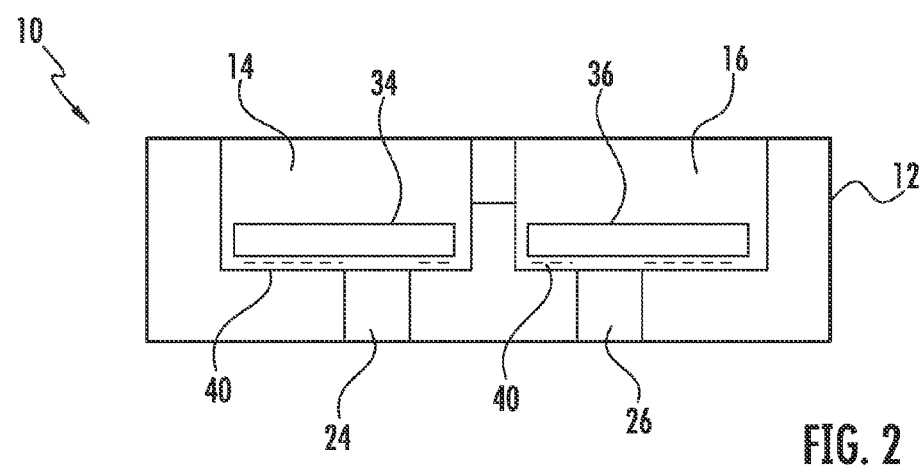
FIG. 2 is a cross-sectional side view of the enclosure assembly illustrated in FIG. 1 with the optical transmit and receive elements attached to the enclosure assembly.
Figure 3:
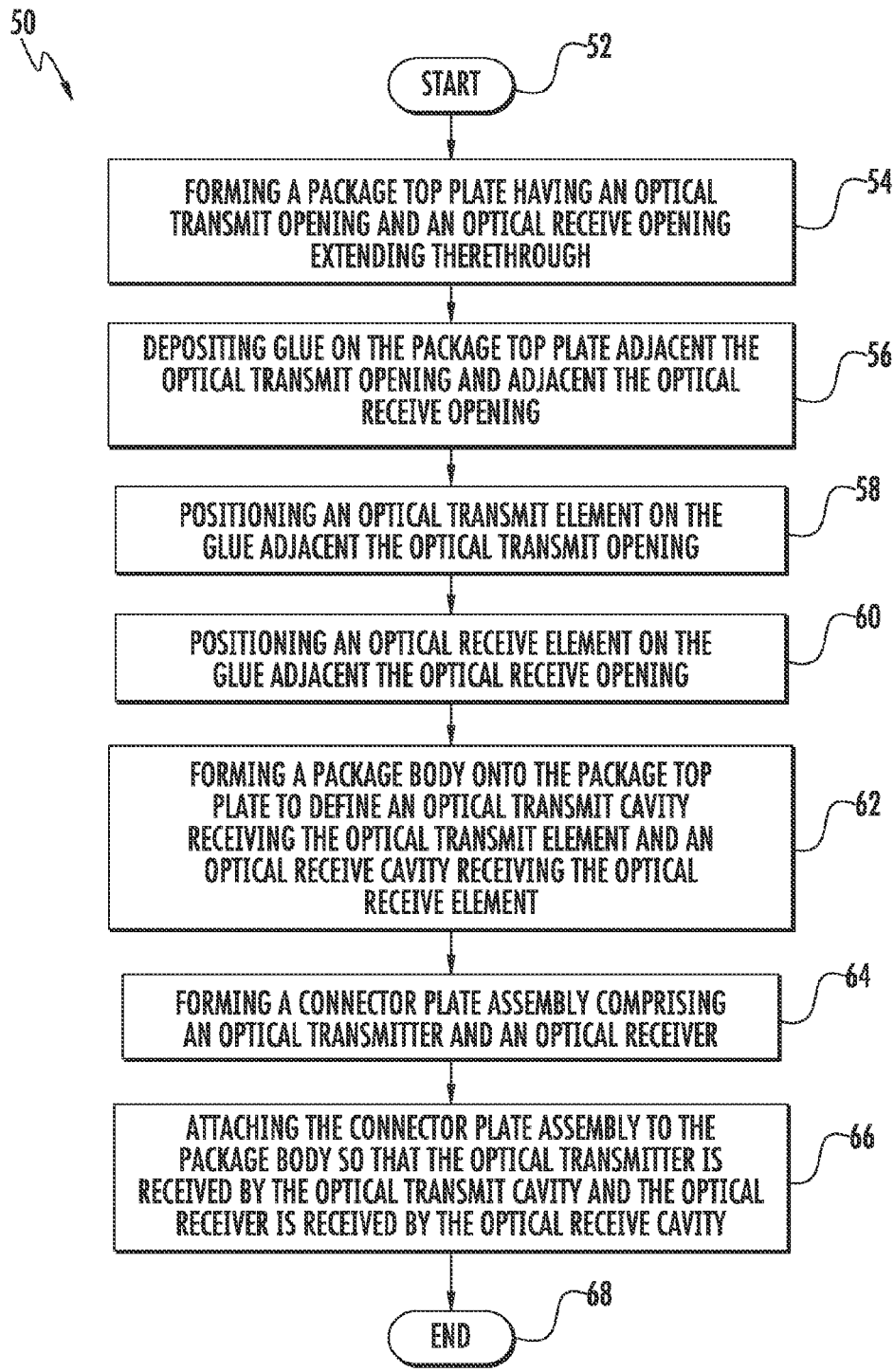
FIG. 3 is a flowchart illustrating a method for making an optical proximity sensor in accordance with the present invention.
Figure 4:
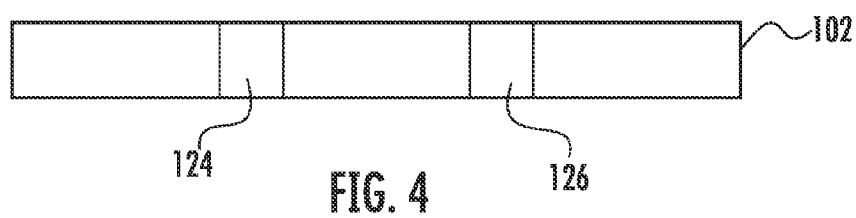
FIG. 4 is a cross-sectional side view of a package top plate formed in accordance with the present invention.

Referring now to the flowchart 50 illustrated in FIG. 3 and to the corresponding cross-sectional side views illustrated in FIGS. 4-8, a method for making an optical proximity sensor 100 will be discussed. From the start (Block 52), the method comprises forming a package top plate 102 at Block 54 having an optical transmit opening 124 and an optical receive opening 126 extending therethrough, as illustrated in FIG. 4. A diameter of the optical transmit opening and the optical receive opening is within a range of about 0.3-0.5 millimeters, for example.

The package top plate 102 may be formed using injection molding. The material used in the injection molding may be thermoplastic, for example. In the illustrated embodiment, the package top plate 102 has a planar surface.

Figure 5:
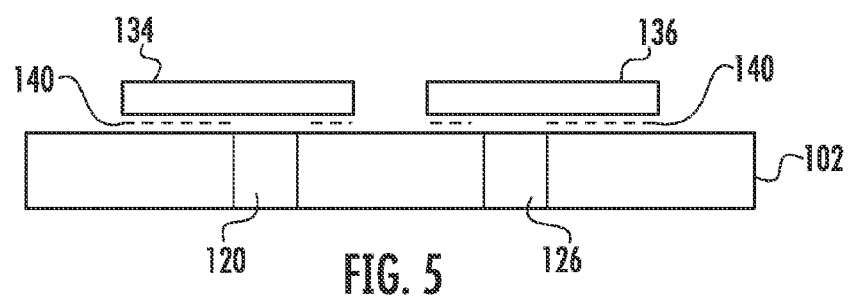
FIG. 5 is the cross-sectional side view of the package top plate illustrated in FIG. 4 with the optical transmit element and the optical receive element attached thereto.

Glue 140 is then deposited on the package top plate 102 at Block 56 adjacent the optical transmit opening 124 and adjacent the optical receive opening 126, as illustrated in FIG. 5. The glue 140 may be deposited using a printing method, for example. Separately forming the package top plate 102 advantageously provides plenty of room to dispense the glue 140 adjacent the optical transmit and receive openings 124, 126. This is particularly beneficial since the trend is to reduce dimensions of optical proximity sensors.

An optical transmit element 134 is positioned on the glue 140 at Block 58 adjacent the optical transmit opening 124, and an optical receive element 136 is positioned on the glue 140 at Block 60 adjacent the optical receive opening 126, as illustrated in FIG. 5. The optical transmit element 134 and the optical receive element 136 are formed from a transparent material, such as glass, for example. A coating may be applied to the transparent material so as to filter out unnecessary light.

Separately forming the package top plate 102 may allow for an increase in the throughput of making the optical proximity sensor 100 since attachment of the optical transmit and receive elements 134, 136 has been simplified. This is particular so since a thickness of the optical transmit element 134 and the optical receive element 136 is typically within a range of about 200-300 microns, for example.

The illustrated optical transmit and receive elements 134, 136 are rectangular shaped. Each side of the optical transmit element 134 and the optical receive element 136 is within a range of about 0.5-1.00 millimeters, for example. In other embodiments, the optical transmit and receive elements 134, 136 may have a non-rectangular shape, such as a circular shape, for example.

Separately forming the package top plate 102 may allow for an increase in the throughput of making the optical proximity sensor 100 since attachment of the optical transmit and receive elements 134, 136 has been simplified, as readily appreciated by those skilled in the art.

Figure 6:
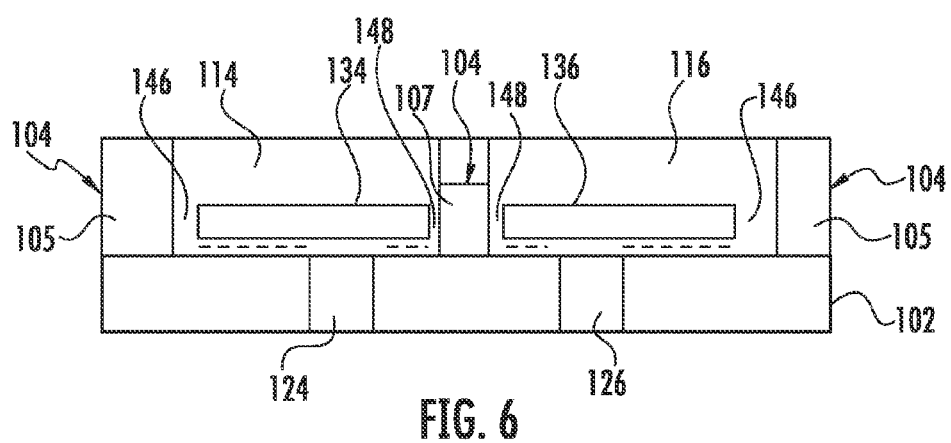
FIG. 6 is the cross-sectional side view of the package top plate illustrated in FIG. 5 with a package body formed thereon.

A package body 104 is formed onto the package top plate 102 at Block 62 to define an optical transmit cavity 114 receiving the optical transmit element 134 and an optical receive cavity 116 receiving the optical receive element 136, as illustrated in FIG. 6. The package body 104 includes sidewalls 105 around an outer perimeter of the package top plate 102, and a separation wall 107 between the optical transmit cavity 114 and the optical receive cavity 116.

Figure 7:
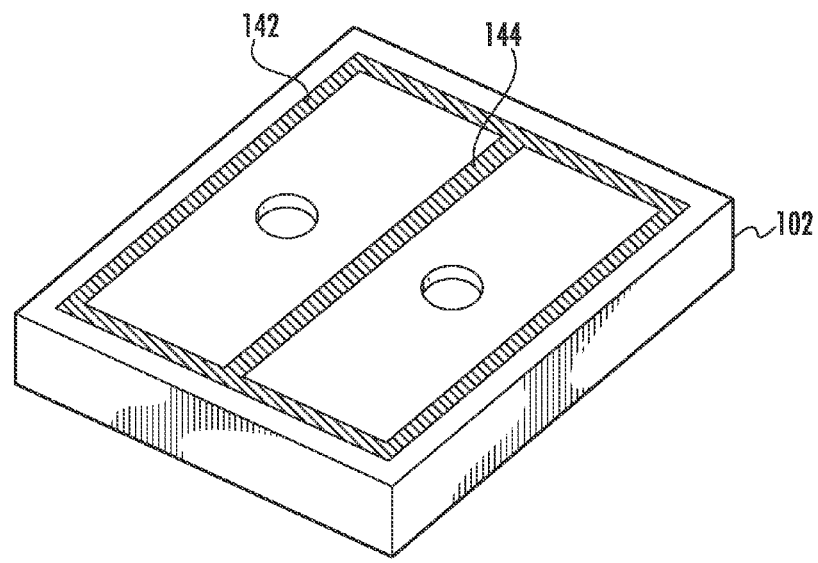
FIG. 7 is a perspective view of the package top plate illustrated in FIG. 4 with a groove formed therein.

As with the package top plate 102, injection molding may be used to form the package body 104. The material used in the injection molding may be thermoplastic, for example. Prior to forming the package body 104 onto the package top plate 102, a groove 142 may be formed around the outer perimeter of the package top plate 102, as illustrated in FIG. 7. A groove 144 may also be formed across the package top plate 102 where the separation wall 107 is to be formed. This grooves 142, 144 help to increase the bond between the package body 104 and the package top plate 102, as readily appreciated by those skilled in the art.

Figure 8:
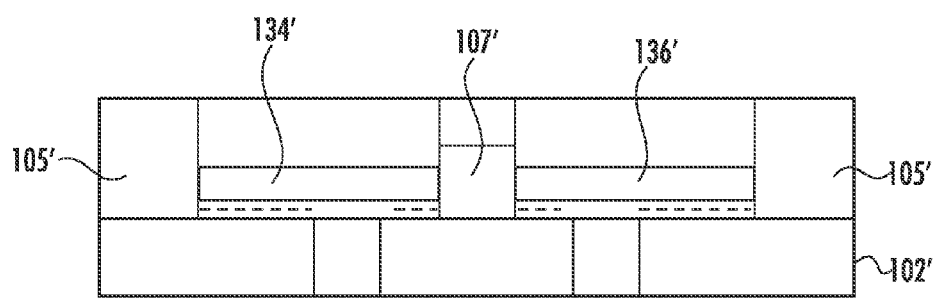
FIG. 8 is a cross-sectional side view of another embodiment of the package body formed onto the package top plate illustrated in FIG. 6.
Figure 9:
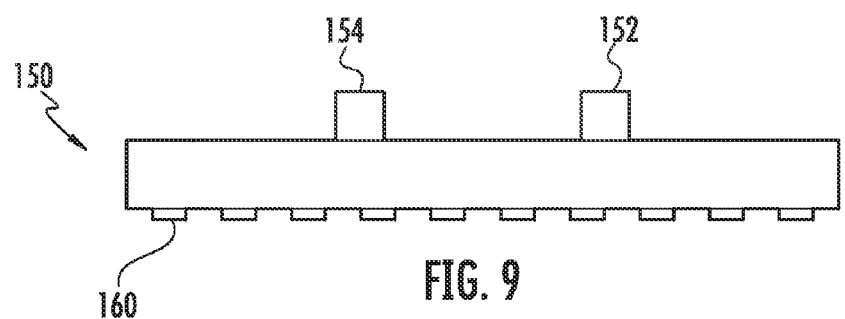
FIG. 9 is a cross-sectional side view of a connector plate assembly with an optical transmitter and an optical receiver in accordance with the present invention.

In the illustrated embodiment, the package body 104 is formed so that there is a gap 146 between the sidewalls 105 and outer edges of the optical transmit and receive elements 134 and 136. Similarly, there is also a gap 148 between the separation wall 107 and outer edges of the optical transmit and receive elements 134 and 136. In an alternate embodiment, the package body 104' is formed so that the sidewalls 105' and the separation wall 107' contact the outer edges of the optical transmit and receive elements 134', 136', as illustrated in FIG. 8.

A connector plate assembly 150 comprising an optical transmitter 152 and an optical receiver 154 is formed at Block 64. The optical transmitter 152 may be configured as an LED and the optical receiver 154 may be configured as a photo diode, for example. Other types of optical transmitters and receivers 152, 154 may be used, as readily appreciated by those skilled in the art. The connector plate assembly 150 includes connector pins 160 for the optical transmitter 152 and optical receiver 154.

Figure 10:
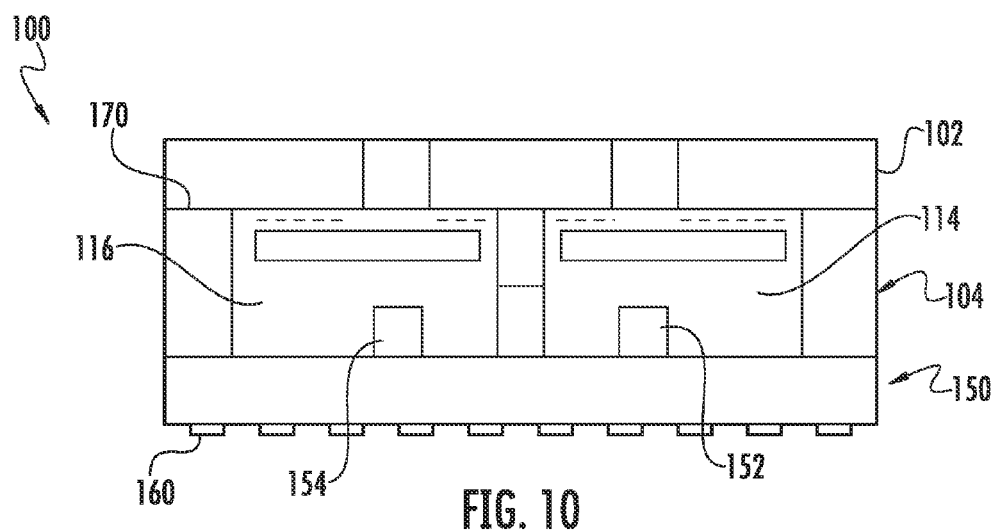
FIG. 10 is the cross-sectional side view of the connector plate assembly illustrated in FIG. 9 attached to the package body illustrated in FIG. 6.

The connector plate assembly 150 is attached to the package body 104 so that the optical transmitter 152 is received by the optical transmit cavity 114 and the optical receiver 154 is received by the optical receive cavity 116, as illustrated in FIG. 10. The method ends at Block 68.

Another aspect is directed to an optical proximity sensor 100 as described above where a joint line 170 is formed at an interface between the package body 104 and said package top plate 102. The optical proximity sensor 100 includes a package top plate 102 having an optical transmit opening 24 and an optical receive opening 26 both extending through the package top plate. An optical transmit element 34 is attached to the package top plate 102 adjacent the optical transmit opening 24. An optical receive element 36 is attached to the package top plate 102 adjacent the optical receive opening 26.

A package body 104 is attached onto the package top plate 102 to define an optical transmit cavity 116 receiving the optical transmit element 134 and an optical receive cavity 114 receiving the optical receive element 136. The joint line 170 is formed at the interface between the package body 104 and the package top plate 102.

A connector plate assembly 150 includes an optical transmitter 152 and an optical receiver 154 attached to the package body 104 so that the optical transmitter is aligned with the optical transmit cavity 114 and the optical receiver is aligned with the optical receive cavity 116.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making an optical proximity sensor comprising:
   forming a package top plate comprising an optical transmit opening and an optical receive opening both extending from a first surface of the package top plate through the package top plate to a second surface of the package top plate, wherein the first surface is an exterior surface of the optical proximity sensor opposite the second surface;
   attaching an optical transmit element to the second surface of the package top plate adjacent the optical transmit opening;
   attaching an optical receive element to the second surface of the package top plate adjacent the optical receive opening; and
   forming a package body onto the second surface of the package top plate to define an optical transmit cavity surrounding the optical transmit element and an optical receive cavity surrounding the optical receive element.

2. The method according to claim 1 wherein the first surface of the package top plate is a planar surface.

3. The method according to claim 1 further comprising depositing glue on the package top plate adjacent the optical transmit opening and the optical receive opening before attaching the optical transmit and receive elements.

4. The method according to claim 1 wherein forming the package body comprises forming sidewalls along an outer perimeter of the package top plate, and a separation wall between the optical transmit cavity and the optical receive cavity.

5. The method according to claim 4 wherein the package body is formed so that the sidewalls and the separation wall contact outer edges of the optical transmit element and outer edges of the optical receive element.

6. The method according to claim 1 further comprising:
   forming a connector plate assembly comprising an optical transmitter and an optical receiver; and
   attaching the connector plate assembly to the package body so that the optical transmitter is aligned with the optical transmit cavity and the optical receiver is aligned with the optical receive cavity, wherein the package body is between the package top plate and the connector plate assembly.

7. The method according to claim 1 wherein the optical transmit element and the optical receive element each comprises glass.

8. The method according to claim 1 wherein a thickness of each of the optical transmit element and the optical receive element is within a range of about 200-300 microns.

9. The method according to claim 1 wherein the optical transmit element and the optical receive element are each rectangular shaped.

10. The method according to claim 9 wherein each side of the optical transmit element and the optical receive element is within a range of 0.5-1.0 millimeters.

11. The method according to claim 1 wherein a diameter of each of the optical transmit opening and the optical receive opening is within a range of 0.3-0.5 millimeters.

12. The method according to claim 1 wherein the package top plate and the package body are each formed using thermoplastic molding material.

13. A method for making an optical proximity sensor comprising:
   forming a package top plate comprising an optical transmit opening and an optical receive opening both extending from a first surface of the package top plate through the package top plate to a second surface of the package top plate, wherein the first surface is an exterior surface of the optical proximity sensor opposite the second surface;
   depositing glue on the second surface of the package top plate adjacent the optical transmit opening and adjacent the optical receive opening;
   attaching an optical transmit element to the second surface of the package top plate adjacent the optical transmit opening;
   attaching an optical receive element to the second surface of the package top plate adjacent the optical receive opening; and
   forming a package body onto the second surface of the package top plate comprising sidewalls along an outer perimeter of the package top plate and a separation wall extending between the sidewalls to define an optical transmit cavity surrounding the optical transmit element and an optical receive cavity surrounding the optical receive element.

14. The method according to claim 13 wherein the first surface of the package top plate is a planar surface.

15. The method according to claim 13 wherein the package body is formed so that the sidewalls and the separation wall contact outer edges of the optical transmit element and outer edges of the optical receive element.

16. The method according to claim 13 further comprising:
   forming a connector plate assembly comprising an optical transmitter and an optical receiver; and
   attaching the connector plate assembly to the package body so that the optical transmitter is aligned with the optical transmit cavity and the optical receiver is aligned with the optical receive cavity, wherein the package body is between the package top plate and the connector plate assembly.

17. The method according to claim 13 wherein the optical transmit element and the optical receive element each comprises glass.

18. The method according to claim 13 wherein the optical transmit element and the optical receive element are rectangular shaped.

19. The method according to claim 13 wherein the package top plate and the package body are forming using thermoplastic molding material.

20. An optical proximity sensor comprising:
 a package top plate comprising an optical transmit opening and an optical receive opening both extending from a first surface of the package top plate through the package top plate to a second surface of the package top plate, wherein the first surface is an exterior surface of the optical proximity sensor opposite the second surface;
 an optical transmit element attached to the second surface of the package top plate adjacent the optical transmit opening;
 an optical receive element attached to the second surface of the package top plate adjacent the optical receive opening;
 a package body attached onto the second surface of the package top plate to define an optical transmit cavity surrounding the optical transmit element and an optical receive cavity surrounding the optical receive element, with a joint line being formed at an interface between the package body and the package top plate, wherein the joint line is parallel to the interface; and
 a connector plate assembly comprising an optical transmitter and an optical receiver attached to the package body so that the optical transmitter is aligned with the optical transmit cavity and the optical receiver is aligned with the optical receive cavity, wherein the package body is between the package top plate and the connector plate assembly.

21. The optical proximity sensor according to claim 20 wherein the first surface of the package top plate is a planar surface.

22. The optical proximity sensor according to claim 20 further comprising glue between the package top plate adjacent the optical transmit opening and the optical transmit element, and between the package top plate adjacent the optical receive opening and the optical receive element.

23. The optical proximity sensor according to claim 20 wherein the package body forms sidewalls along an outer perimeter of the package top plate, and a separation wall between the optical transmit cavity and the optical receive cavity, with the sidewalls and the separation wall contacting outer edges of the optical transmit element and outer edges of the optical receive element.

24. The optical proximity sensor according to claim 20 wherein the optical transmit element and the optical receive element each comprises glass.

25. The optical proximity sensor according to claim 20 wherein the optical transmit element and the optical receive element are each rectangular shaped.

* * * * *